(12) United States Patent
Ogasawara et al.

(10) Patent No.: US 8,867,010 B2
(45) Date of Patent: Oct. 21, 2014

(54) DISPLAY PANEL AND METHOD FOR PRODUCING THE SAME

(75) Inventors: Isao Ogasawara, Osaka (JP); Tatsuji Saitoh, Osaka (JP); Junichi Mori, Osaka (JP); Katsuya Ogawa, Osaka (JP); Kazunori Tanimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 106 days.

(21) Appl. No.: 13/818,470

(22) PCT Filed: Jul. 7, 2011

(86) PCT No.: PCT/JP2011/065578
§ 371 (c)(1),
(2), (4) Date: Feb. 22, 2013

(87) PCT Pub. No.: WO2012/029406
PCT Pub. Date: Mar. 8, 2012

(65) Prior Publication Data
US 2013/0155345 A1    Jun. 20, 2013

(30) Foreign Application Priority Data

Aug. 31, 2010   (JP) ................................. 2010-194499

(51) Int. Cl.
| | | |
|---|---|---|
| *G02F 1/1333* | (2006.01) | |
| *G02F 1/1362* | (2006.01) | |
| *H01L 27/12* | (2006.01) | |
| *G02F 1/1345* | (2006.01) | |
| *G09G 3/36* | (2006.01) | |

(52) U.S. Cl.
CPC .. *G02F 1/136286* (2013.01); *G09G 2300/0426* (2013.01); *G02F 2001/136295* (2013.01); *G02F 2001/13456* (2013.01); *G02F 2202/09* (2013.01); *G02F 2001/136236* (2013.01); *G02F 1/1333* (2013.01); *G02F 1/13458* (2013.01); *G09G 3/3648* (2013.01); *G02F 1/13452* (2013.01); *H01L 27/124* (2013.01); *G02F 2202/02* (2013.01); *G02F 1/133345* (2013.01); *H01L 27/1248* (2013.01)
USPC ............ 349/152; 349/149; 349/150; 349/151

(58) Field of Classification Search
USPC .................................................. 349/149–152
See application file for complete search history.

(56) References Cited

U.S. PATENT DOCUMENTS

2009/0079890 A1    3/2009  Tanabe et al.

FOREIGN PATENT DOCUMENTS

| JP | 11-153809 A | 6/1999 |
|---|---|---|
| JP | 2005-17926 A | 1/2005 |
| JP | 2009-080279 A | 4/2009 |
| JP | 2009-128761 A | 6/2009 |

OTHER PUBLICATIONS

Official Communication issued in International Patent Application No. PCT/JP2011/065578, mailed on Aug. 16, 2011.

*Primary Examiner* — Phu Vu
(74) *Attorney, Agent, or Firm* — Keating & Bennett, LLP

(57) ABSTRACT

A display panel has a plurality of gate terminals that are formed of a gate metal layer and a plurality of source terminals that are formed of a source metal layer, disposed alternately as seen in a plane. From each of the source terminals an intermediate region and a terminal region are provided with inorganic insulating film such that a source terminal lead formed of the source metal layer is covered therewith. The intermediate region is provided with organic insulating film such that the inorganic insulating film is covered therewith. The inorganic insulating film is smaller in thickness in the terminal region than in the intermediate region. The inorganic insulating film has an opening in the terminal region to expose at least a portion of a surface of the source terminal.

6 Claims, 18 Drawing Sheets

DISPLAY PANEL AND METHOD FOR PRODUCING THE SAME

TECHNICAL FIELD

The present invention relates to a display panel and a method for producing the same. The "display panel" is for example a liquid crystal display panel. The present invention is also applicable to display panels other than the liquid crystal display panel.

BACKGROUND ART

A liquid crystal display panel is known as a type of a display panel including a bottom gate type TFT element. An example of such a liquid crystal display panel is indicated in Japanese Patent Laying-Open No. 2005-017926 (PTL 1). PTL 1 describes that a gate wiring is provided by utilizing an electrically conducting film used to provide a gate electrode and a source wiring is provided in a direction orthogonal to the gate wiring. A gate terminal is provided at an end of the gate wiring, and a source terminal is provided at an end of the source wiring.

The display panel including the bottom gate type TFT element has disadvantages, which are handled with techniques indicated in Japanese Patent Laying-Open Nos. 2009-128761 (PTL 2), 11-153809 (PTL 3), and 2009-080279 (PTL 4)

CITATION LIST

Patent Literature

PTL 1: Japanese Patent Laying-Open No. 2005-017926
PTL 2: Japanese Patent Laying-Open No. 2009-128761
PTL 3: Japanese Patent Laying-Open No. 11-153809
PTL 4: Japanese Patent Laying-Open No. 2009-080279

SUMMARY OF INVENTION

Technical Problem

In a terminal region a terminal can be a gate terminal utilizing a gate metal layer and a source terminal utilizing a source metal layer. Normally, as indicated in PTL 1, two sides outer than a display region are used and a plurality of gate terminals are disposed at one side and a plurality of source terminals are disposed at the other side. However, there is also a case in which the plurality of gate terminals and the plurality of source terminals are both disposed along one side of the display region. Hereinafter, when a display panel's structural, vertical relationship is referred to, a side with a substrate corresponds to a lower/bottom side and a layer is deposited upward successively for the sake of illustration.

The gate metal layer is below a gate insulating film, and the source metal layer is above the gate insulating film. The gate terminal and a gate terminal lead can remain covered with the gate insulating film except for a portion of a surface of the gate terminal that is indeed used for electrical connection, and accordingly, a subsequent process is performed through a variety of steps while a portion of the gate terminal and the gate terminal lead wiring are protected by the gate insulating film.

In contrast, the source terminal and a source terminal lead are located above the gate insulating film, and accordingly, cannot be covered with and protected by the gate insulating film and thus tend to be exposed. Accordingly in the subsequent process when a variety of steps are performed the source terminal and the source terminal lead may be damaged, corroded, cut or the like. In particular, the source terminal lead is thin, normally having a width of about 3-5 μm, and may thus be cut.

Accordingly, the present invention contemplates a structure in which a display panel has an external connection terminal provided along a single side by disposing a gate metal layer and a source metal layer in combination, that can have a source terminal lead protected, and a method for producing the same.

Various terms used herein have meanings, respectively, as indicated below: A display region has a large number of wirings extending longitudinally and laterally in parallel, of which a wiring electrically connected to a gate electrode of a TFT element will be referred to as a "gate wiring" and a wiring electrically connected to a source electrode of the TFT element will be referred to as a "source wiring". A terminal region is provided with a large number of terminals for some electrical connection to either the gate wiring or the source wiring, respectively. A terminal utilizing gate metal is referred to as a "gate terminal", and a wiring formed of gate metal to lead the gate terminal is referred to as a "gate terminal lead". A terminal utilizing source metal is referred to as a "source terminal", and a wiring formed of source metal to lead the source terminal is referred to as a "source terminal lead". The gate terminal may not be provided as a continuation of the gate wiring, and the source terminal may not be provided as a continuation of the source wiring. For example, the terminal utilizing gate metal, or the gate terminal, may be connected to the source wiring. In that case, a structure is provided to implement electrical connection between the source wiring and the gate terminal.

Solution to Problem

To achieve the above object, the present invention provides a display panel that has: a display region including a plurality of pixels, a terminal region disposed outer than the display region, as seen in a plane, and an intermediate region located between the display region and the terminal region; and a drive element for driving the pixel. The drive element includes a gate electrode, a gate insulating film covering the gate electrode, and a source electrode partially covering the gate insulating film. The terminal region has a plurality of gate terminals and a plurality of source terminals disposed therein alternately as seen in a plane, the plurality of gate terminals being formed of a gate metal layer that is the same layer as the gate electrode, the plurality of source terminals being formed of a source metal layer that is the same layer as the source electrode. From each of the source terminals, a source terminal lead extends toward the intermediate region, the source terminal lead being formed of the source metal layer. The intermediate region and the terminal region are provided with inorganic insulating film such that the source terminal lead is covered therewith. The intermediate region is provided with organic insulating film such that the inorganic insulating film is covered therewith. The inorganic insulating film is smaller in thickness in the terminal region than in the intermediate region. The inorganic insulating film has an opening in the terminal region to expose at least a portion of a surface of the source terminal

Advantageous Effects of Invention

The present invention that allows a terminal region to have a source terminal lead covered with inorganic insulating film can provide a structure in which a display panel has an external connection terminal provided along a single side by disposing a gate metal layer and a source metal layer in combination, that can have a source terminal lead protected.

DESCRIPTION OF EMBODIMENTS

First Embodiment

Figure 1:
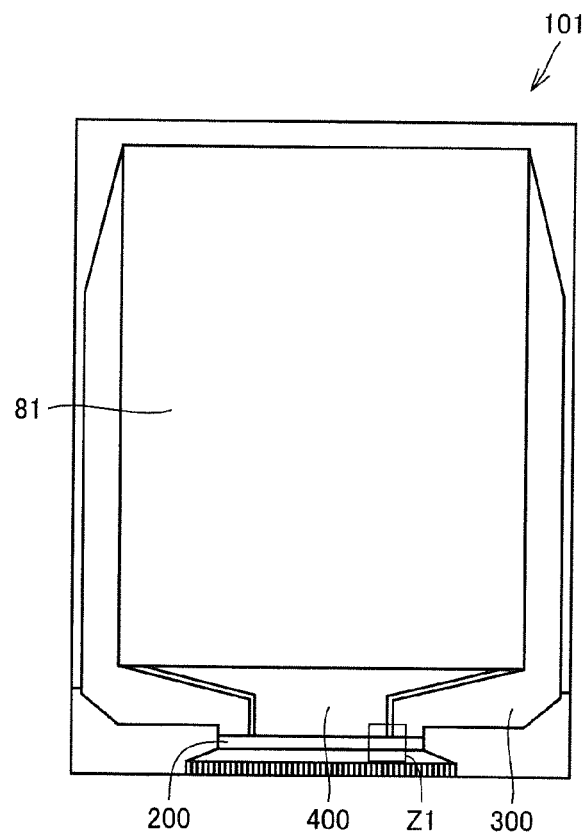
FIG. 1 is a plan view of a display panel in a first embodiment based on the present invention.
Figure 2:
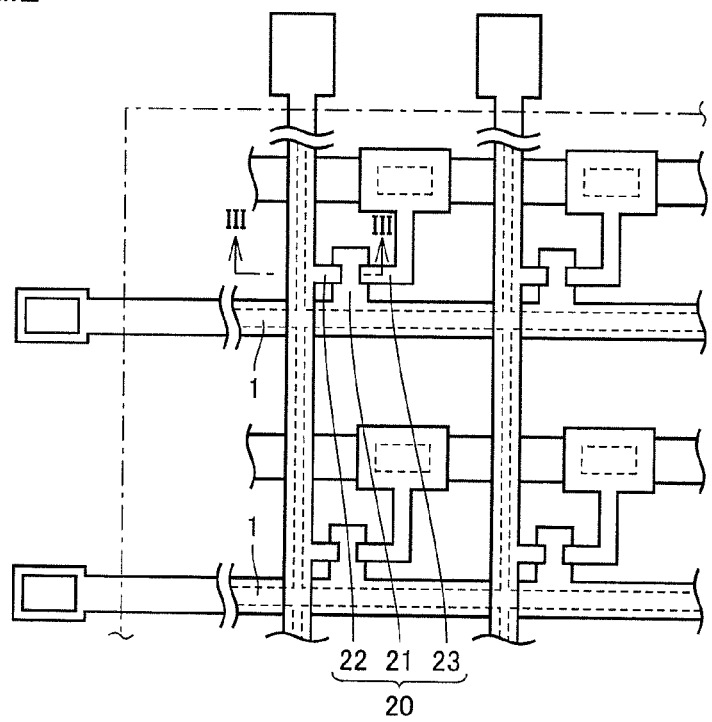
FIG. 2 is an enlarged view of a display region of the display panel in the first embodiment based on the present invention.
Figure 3:
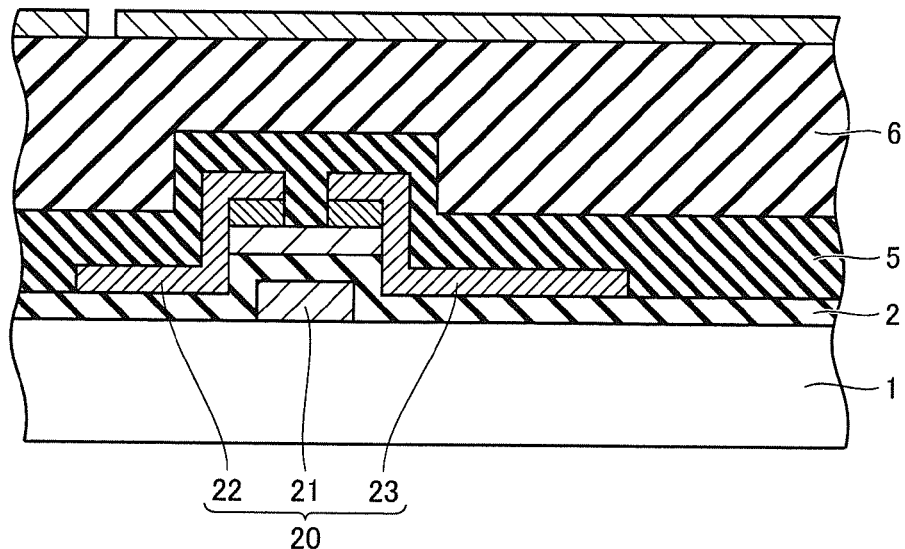
FIG. 3 is a cross section in a vicinity of a drive element of the display panel in the first embodiment based on the present invention.

With reference to FIG. 1 to FIG. 5, the present invention in a first embodiment provides a display panel, as will be described hereinafter. Initially, FIG. 1 generally shows the display panel in the present embodiment. This display panel is a liquid crystal display panel 101. Liquid crystal display panel 101 is produced using a glass substrate, and, as seen in a plane, it has a portrait display region 81 at a portion thereof slightly upper than the center, and a driver 200 in a vicinity of a lower side thereof. Display region 81 includes a plurality of pixels for displaying an image. As shown in FIG. 2, display region 81 is provided with a TFT element 20 as a drive element for driving each pixel. Each TFT element 20 includes a gate electrode 21, a source electrode 22, and a drain electrode 23. FIG. 3 is a cross section taken along a line III-III indicated in FIG. 2. TFT element 20 is of a so-called bottom gate type. In TFT element 20, gate electrode 21 is disposed on an upper surface of a substrate 1 and covered with a gate insulating film 2 and source electrode 22 and drain electrode 23 partially overlap an upper surface of gate insulating film 2. Drain electrode 23 is electrically connected to a pixel electrode. Gate insulating film 2 may be formed for example of $SiN_x$ or $SiO_x$.

Note that a layer formed of the same material as gate electrode 21 concurrently will be referred to as a "gate metal layer", and a layer formed of the same material as source electrode 22 concurrently will be referred to as a "source metal layer" for the sake of illustration.

In FIG. 1, a large number of scanning signal lines, i.e., a gate wiring group 300, extends from driver 200 towards each of the right and left sides of display region 81. A large number of data signal lines, i.e., a source wiring group 400, extends from driver 200 towards a bottom side of display region 81. In FIG. 1, gate and source wiring groups 300 and 400 appear to indicate a blank region. In reality, this region has a large number of significantly thin wirings disposed therein to form a striped pattern having too small a pitch, and accordingly, gate and source wiring groups 300 and 400 are not shown and appear to be a blank region. Gate wiring group 300 includes individual wirings to transmit an electrical signal to gate electrodes 21 of TFT elements 20 included in display region 81, and source wiring group 400 includes individual wirings to transmit an electrical signal to source electrodes 22 of TFT elements 20 included in display region 81. TFT element 20 is covered with an inorganic insulating film 5, and inorganic insulating film 5 is covered with an organic insulating film 6. Organic insulating film 6 is larger in thickness than inorganic insulating film 5. Inorganic insulating film 5 may be formed for example of $SiN_x$ or $SiO_x$. Inorganic insulating film 5 may have a thickness of about 0.1-0.6 μm. Organic insulating film 6 may be formed for example of photosensitive acrylic resin. Organic insulating film 6 may have a thickness of about 1-4 μm.

Figure 4:
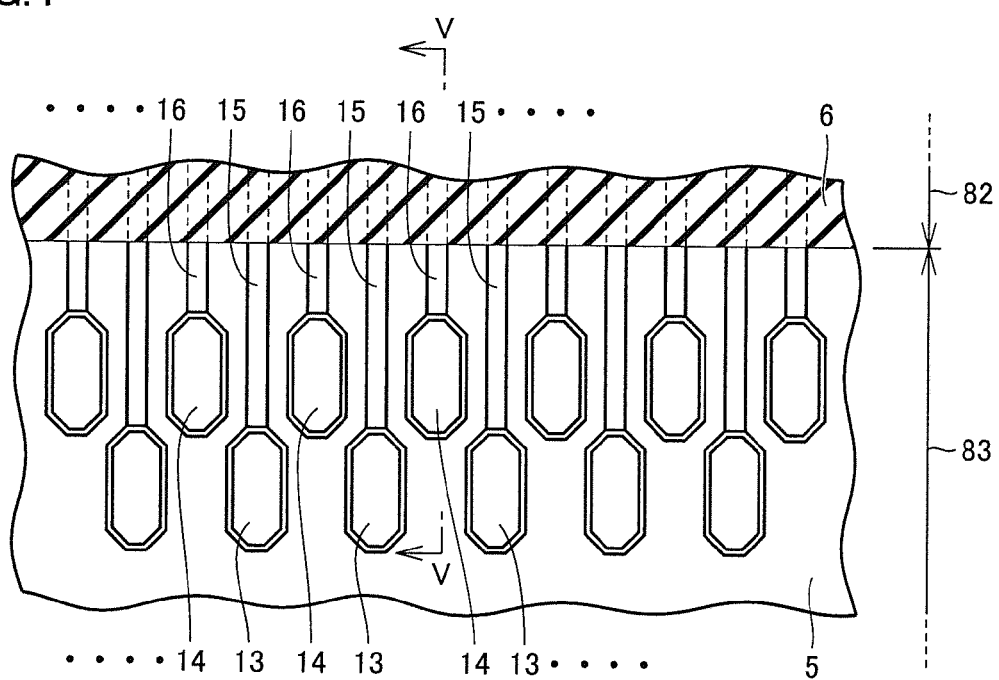
FIG. 4 is an enlarged view of a portion Z1 shown in FIG. 1.

FIG. 4 shows an enlarged view of a portion Z1 shown in FIG. 1. While FIG. 1 shows driver 200 overlapping, FIG. 4 does not show driver 200. In FIG. 4, there can be seen a row of terminals for providing electrical connection between a wiring extending from each side of display region 81 and driver 200. Shown in FIG. 4 is a vicinity of a boundary of an intermediate region 82 and a terminal region 83. Terminal region 83 is provided with a gate terminal 13 and a source terminal 14. Gate terminal 13 and source terminal 14 both have a longitudinal direction and a widthwise direction. Gate terminal 13 and source terminal 14 may be rectangular or oval. Gate terminal 13 and source terminal 14 may be a rectangle having its four corners chamfered to be an octagon, as shown in FIG. 4. Gate terminal 13 and source terminal 14 are larger in width than a gate terminal lead 15 and a source terminal lead 16, respectively.

Gate terminals 13 are spaced by a predetermined distance from an end of intermediate region 82 and thus disposed in parallel, and so are source terminals 14. Gate terminal 13 is disposed farther from intermediate region 82, and source terminal 14 is disposed closer to intermediate region 82. Gate terminal lead 15 and source terminal lead 16 both extend from intermediate region 82 to enter terminal region 83. Gate terminal lead 15 and source terminal lead 16 are disposed in parallel.

In the present embodiment, a gate terminal lead and a gate terminal are electrically connected to a single gate wiring, and a source terminal lead and a source terminal are electrically connected to a gate wiring adjacent to the single gate wiring. Furthermore, a source terminal lead and a source terminal are electrically connected to a single source wiring, and a gate terminal lead and a gate terminal are electrically connected to a source wiring adjacent to the single source wiring.

Figure 5:
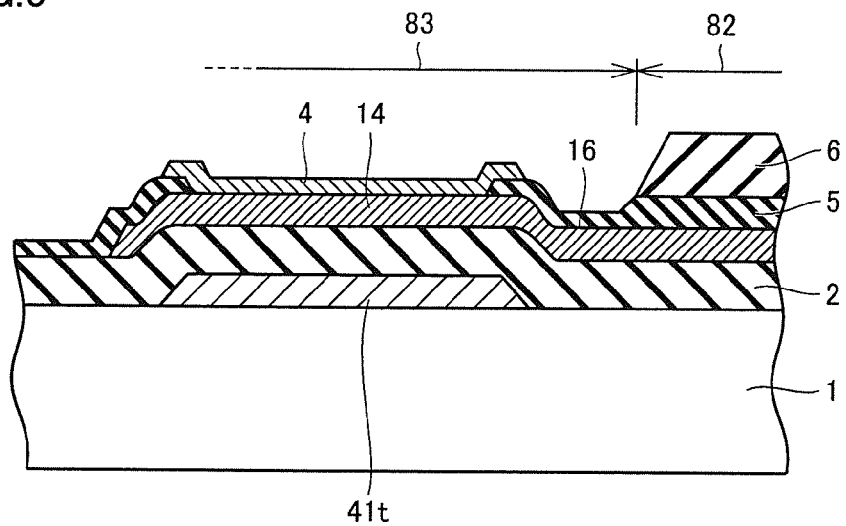
FIG. 5 is a cross section taken along a line V-V indicated in FIG. 4.
Figure 6:
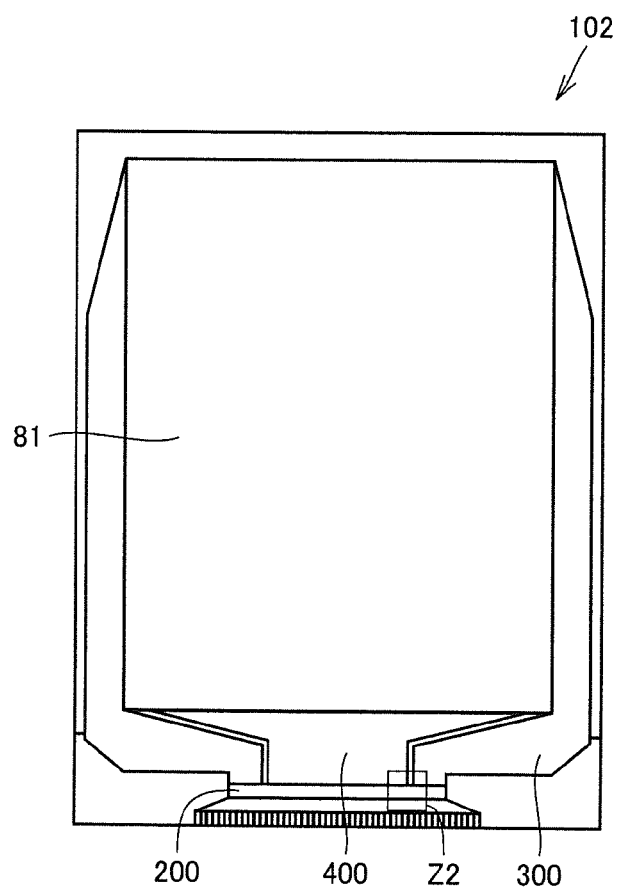
FIG. 6 is a plan view of a display panel in a second embodiment based on the present invention.

FIG. 5 is a cross section taken along a line V-V indicated in FIG. 4. A portion of a source metal layer serves as source terminal 14. Under source terminal 14 is a gate metal layer 41t in the form of an island. In other words, source terminal 14 and gate metal layer 41t overlap. However, source terminal 14 and gate metal layer 41t are electrically isolated by gate insulating film 2. Gate insulating film 2 covers gate metal layer 41t. The source metal layer is covered with inorganic insulating film 5. Inorganic insulating film 5 has an opening at a portion, which is source terminal 14. Source terminal 14 does not have the source metal layer directly exposed but covered with an ITO film 4. In the present embodiment, gate metal layer 41t underlying source terminal 14 is disposed to allow gate terminal 13 and source terminal 14 to match in level, as measured from a surface of substrate 1. Gate metal layer 41t thus disposed allows source terminal 14 to be increased in level to be close to gate terminal 13 in level. This contemplates more reliable connection in mounting driver 200. Note that gate metal layer 41t for such an object may not be disposed for a terminal portion having some particular film configuration, thickness and the like.

As shown in FIG. 5, intermediate region 82 has inorganic insulating film 5 with an upper side covered with organic insulating film 6. Inorganic insulating film 5 is smaller in thickness at a portion thereof uncovered with organic insulating film 6 than at a portion thereof covered with organic insulating film 6.

The present embodiment provides display panel 101 that is a display panel that has display region 81 including a plurality of pixels, terminal region 83 disposed outer than display region 81, as seen in a plane, and intermediate region 82 located between display region 81 and terminal region 83, and has TFT element 20 as a drive element for driving the pixel. The drive element includes gate electrode 21, gate insulating film 2 covering gate electrode 21, and source electrode 22 partially covering gate insulating film 2. Terminal region 83 has a plurality of gate terminals 13, which are formed of a gate metal layer that is the same layer as gate electrode 21, and a plurality of source terminals 14, which are formed of a source metal layer that is the same layer as source electrode 22, disposed therein alternately as seen in a plane. From each source terminal 14, source terminal lead 16 formed of the source metal layer extends toward intermediate region 82. Intermediate region 82 and terminal region 83 are provided with inorganic insulating film 5 such that source terminal lead 16 is covered therewith. Intermediate region 82 is provided with organic insulating film 6 such that inorganic insulating film 5 is covered therewith. Inorganic insulating film 5 is smaller in thickness in terminal region 83 than in intermediate region 82. Inorganic insulating film 5 has an opening in terminal region 83 to expose at least a portion of a surface of source terminal 14.

The present embodiment can provide a display panel having terminal region 83 with source terminal lead 16 covered with thin inorganic insulating film 5, as shown in FIG. 5, and thus provide a structure in which a display panel has an external connection terminal provided along a single side by disposing a gate metal layer and a source metal layer in combination, that can have a source terminal lead protected.

Second Embodiment

Figure 7:
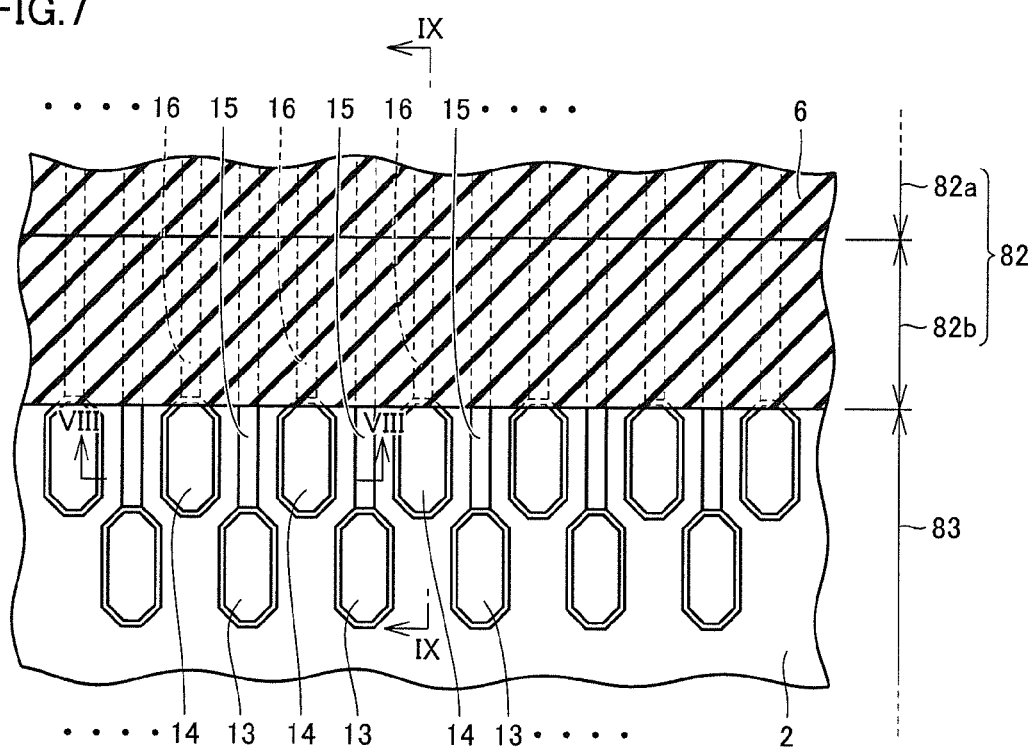
FIG. 7 is an enlarged view of a portion Z2 shown in FIG. 6.

With reference to FIG. 6 to FIG. 9, the present invention in a second embodiment provides a display panel, as will be described hereinafter. Initially, FIG. 6 generally shows the display panel in the present embodiment. This display panel is a liquid crystal display panel 102. FIG. 7 shows an enlarged view of a portion Z2 shown in FIG. 6.

Figure 8:
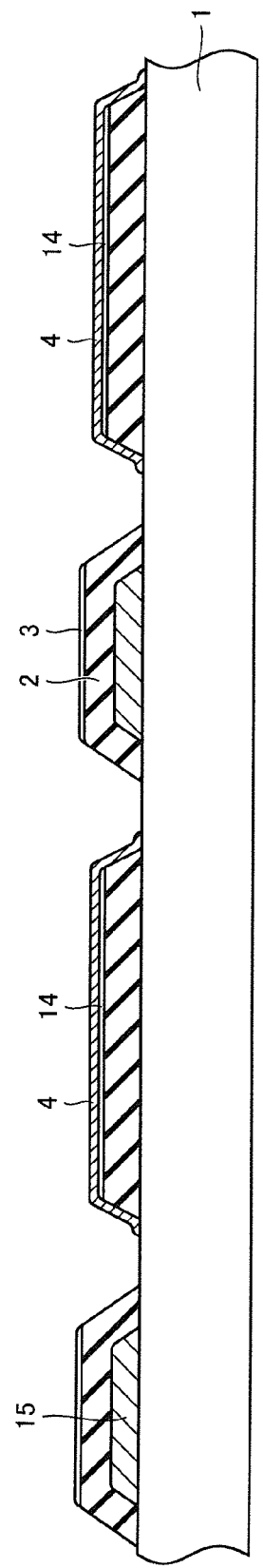
FIG. 8 is a cross section taken along a line VIII-VIII indicated in FIG. 7.

FIG. 8 is a cross section taken along a line VIII-VIII indicated in FIG. 7. FIG. 8 shows substrate 1 and gate terminal lead 15 and source terminal 14 thereon in cross section. Gate terminal lead 15 is formed of a gate metal layer. On gate terminal lead 15, gate insulating film 2 has an upper side covered with a semiconductor layer 3. Source terminal 14 has an upper side covered with ITO film 4 serving as a transparent, electrically conductive film. ITO film 4 also covers a side surface of gate insulating film 2 and reaches a surface of substrate 1.

Figure 9:
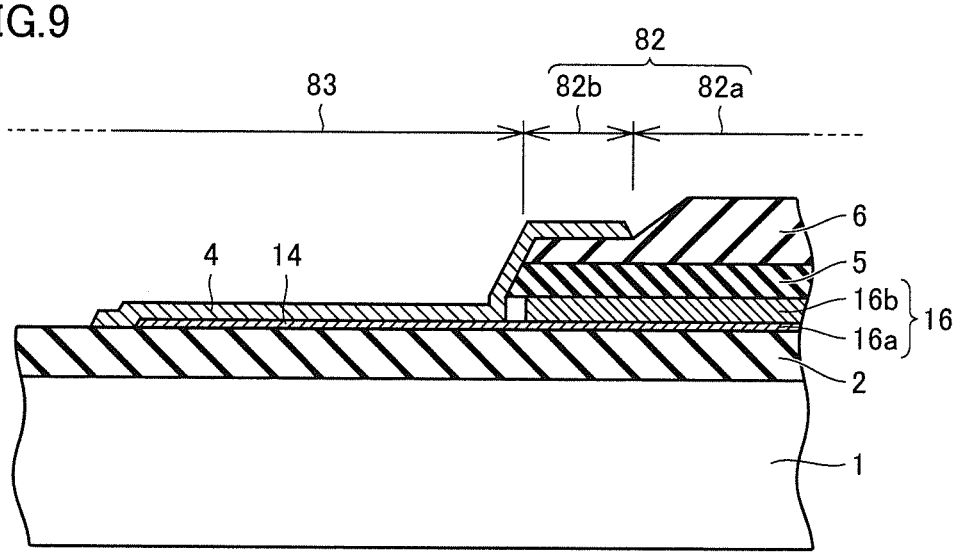
FIG. 9 is a cross section taken along a line IX-IX indicated in FIG. 7.

FIG. 9 is a cross section taken along a line IX-IX indicated in FIG. 7. Liquid crystal display panel 102 includes a drive device, which is identical, as seen in an enlarged cross section, to that of FIG. 3, and accordingly, the drive device and each portion thereof are denoted as indicated in FIG. 3.

The present embodiment provides display panel 102 that is a display panel that has display region 81 including a plurality of pixels, terminal region 83 disposed outer than display region 81, as seen in a plane, and intermediate region 82 located between display region 81 and terminal region 83, and has TFT element 20 as a drive element for driving the pixel. The drive element includes gate electrode 21, gate insulating film 2 covering gate electrode 21, and source electrode 22 partially covering gate insulating film 2. Terminal region 83 has a plurality of gate terminals 13, which are formed of a gate metal layer that is the same layer as gate electrode 21, and a plurality of source terminals 14, which are formed of a source metal layer that is the same layer as source electrode 22, disposed therein alternately as seen in a plane. From each source terminal 14, source terminal lead 16 formed of the source metal layer extends toward intermediate region 82. Intermediate region 82 is provided with inorganic insulating film 5 such that source terminal lead 16 is covered therewith, and organic insulating film 6 such that inorganic insulating film 5 is covered therewith. Intermediate region 82 includes a first sub-intermediate region 82a with organic insulating film 6 having a first thickness, and a second sub-intermediate region 82b located between first sub-intermediate region 82a and terminal region 83 with organic insulating film 6 having a second thickness smaller than the first thickness. Inorganic insulating film 5 is interrupted at a boundary between second sub-intermediate region 82b and terminal region 83 to expose at least a portion of a surface of source terminal 14.

In the present embodiment, the gate metal layer is described as a single layer, however, the gate metal layer is not limited to a single layer. The gate metal layer may be a single layer of Al or Al alloy. Alternatively, it may be TiN/Al/Ti, Ti/Al, Cu/Ti or a similar stack of layers.

While the FIG. 9 example shows a source metal layer having a two-layer structure of a Ti layer 16a and an Al layer 16b, the source metal layer is not limited in structure thereto. The source metal layer may be structured for example of Al alloy/Mo, Mo/Al/Mo, Cu/Ti or the like.

While the FIG. 9 example shows source terminal 14 such that, of the source metal layer, Al layer 16b does not exist and Ti layer 16a extends alone. At a boundary between second sub-intermediate region 82b and terminal region 83, Al layer 16b is etched and thus recedes and inorganic insulating film 5 overhangs. In the FIG. 9 example, ITO film 4 covering source terminal 14 in terminal region 83 extends to rise and thus reach a boundary between second sub-intermediate region 82b and first sub-intermediate region 82a. ITO film 4 my only extend to any position in second sub-intermediate region 82b, or may enter first sub-intermediate region 82a and extend to any position therein.

While the present embodiment has been described based on a structure without a gate metal layer under source terminal 14, as shown in FIG. 9, the gate metal layer may be provided under source terminal 14 to allow terminals to match in level, as done in the first embodiment, for some film configuration, thickness and the like of the terminals.

Figure 10:
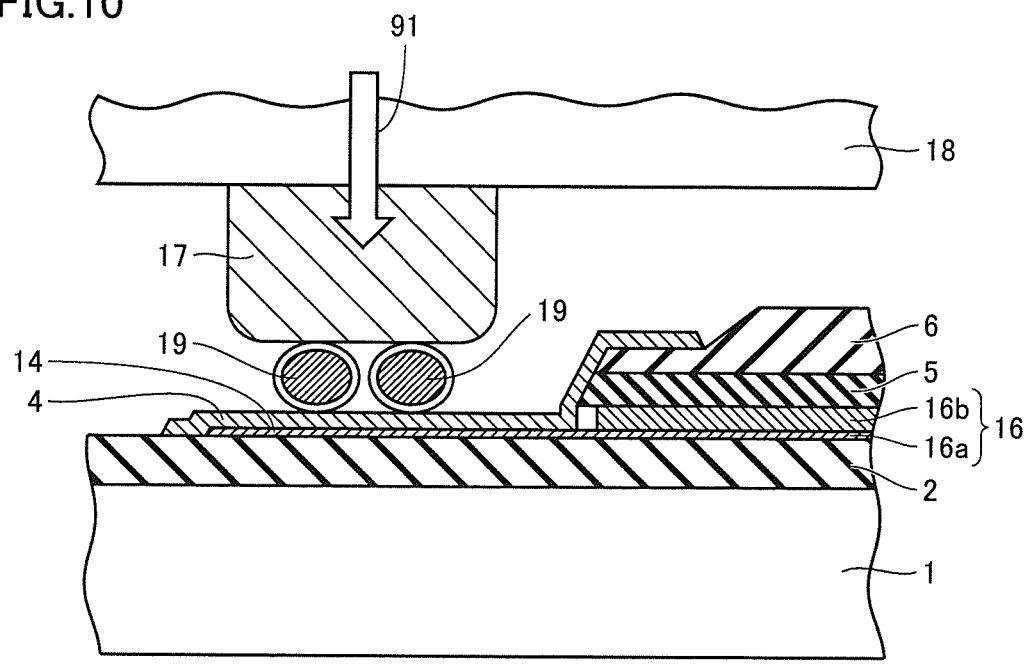
FIG. 10 is a first view for illustrating connecting a source terminal and a bump by using ACF particles.
Figure 11:
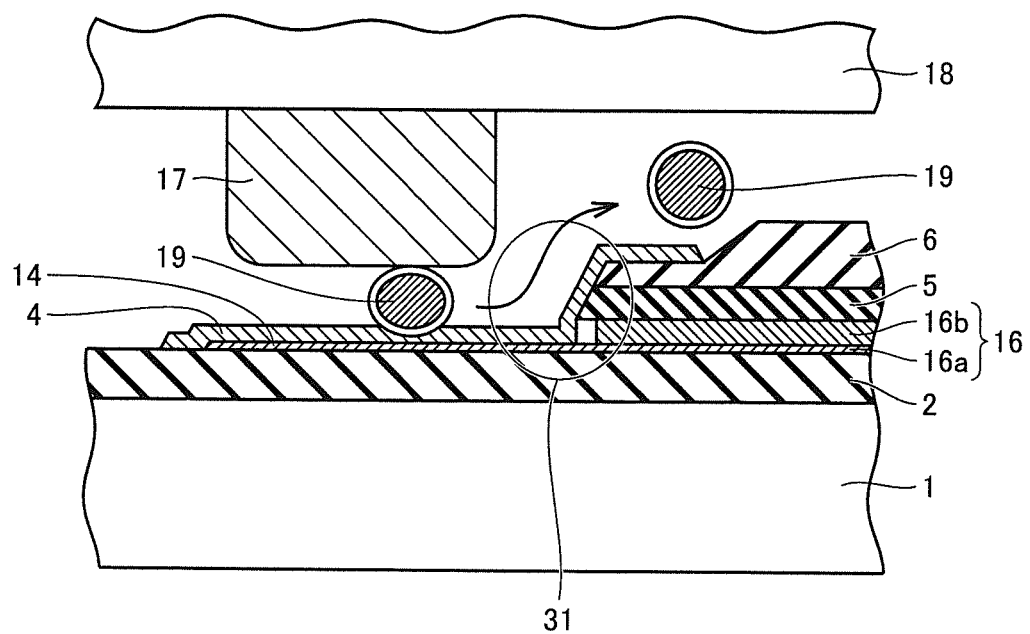
FIG. 11 is a second view for illustrating connecting the source terminal and the bump by using ACF particles.

The present embodiment can provide a display panel having source terminal lead 16 covered with inorganic insulating film 5 and organic insulating film 6 up to a portion close to terminal region 83, and thus provide a structure in which a display panel has an external connection terminal provided along a single side by disposing gate metal and source metal in combination, that can have a source terminal lead protected. In addition, in second sub-intermediate region 82b, organic insulating film 6 is reduced in thickness, and, as shown in FIG. 10, in connecting source terminal 14 and a bump 17 via ACF particles 19 when pressure is applied in a direction indicated by an arrow 91 an excessive ACF particle 19 can escape toward intermediate region 82 smoothly, as shown in FIG. 11, which can prevent ACF particles 19 from aggregating at a step 31 corresponding to a boundary between terminal region 83 and intermediate region 82.

Figure 12:
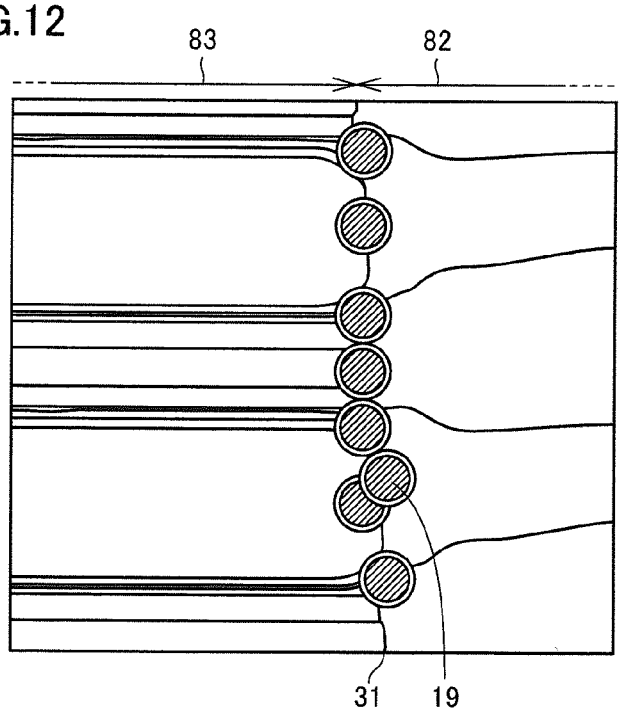
FIG. 12 is a plan view of an example of ACF particles aggregating at a step.

FIG. 12 is a plan view of an example of ACF particles aggregating at step 31. The ACF particle has a diameter for example of about 3-5 μm and thus has a sufficiently large size in comparison with the terminals' spacing (of about several to several tens micrometers). Such aggregation is not preferable as it serves as a cause of leakage of adjacent terminals.

Figure 13:
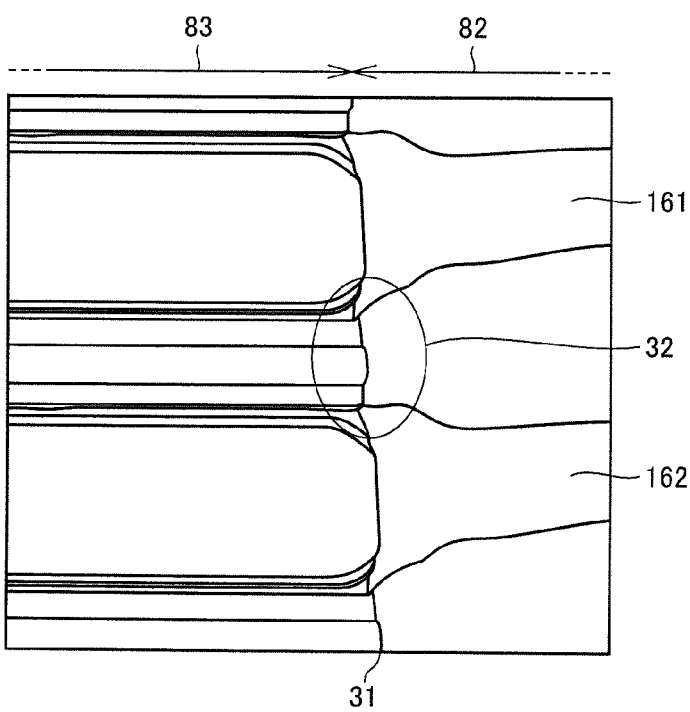
FIG. 13 is a plan view in a vicinity of the step.

FIG. 13 shows a vicinity of step 31 as seen in a plane. ITO film 4 is provided for each terminal, as follows: ITO film is once provided on an entire surface and thereon a resist film pattern is formed and used to pattern ITO film 4. For example, a portion 32 is a gap between the terminals, and accordingly, the ITO film should be removed. However, if step 31 has a large difference in level, the resist film has an increased thickness at portion 32 of step 31 that should have the resist film removed therefrom. Accordingly, the resist film remains at portion 32 and the ITO film is insufficiently removed, and as a result, mutually adjacent wirings 161, 162 may short-circuit. The present embodiment provides a display panel having second sub-intermediate region 82b with organic insulating film 6 reduced in thickness, which can contribute to step 31 having a small limited difference in level, and hence a reduced incidence of defective short circuit that would otherwise be caused as the ITO film would remain.

Third Embodiment

Figure 14:
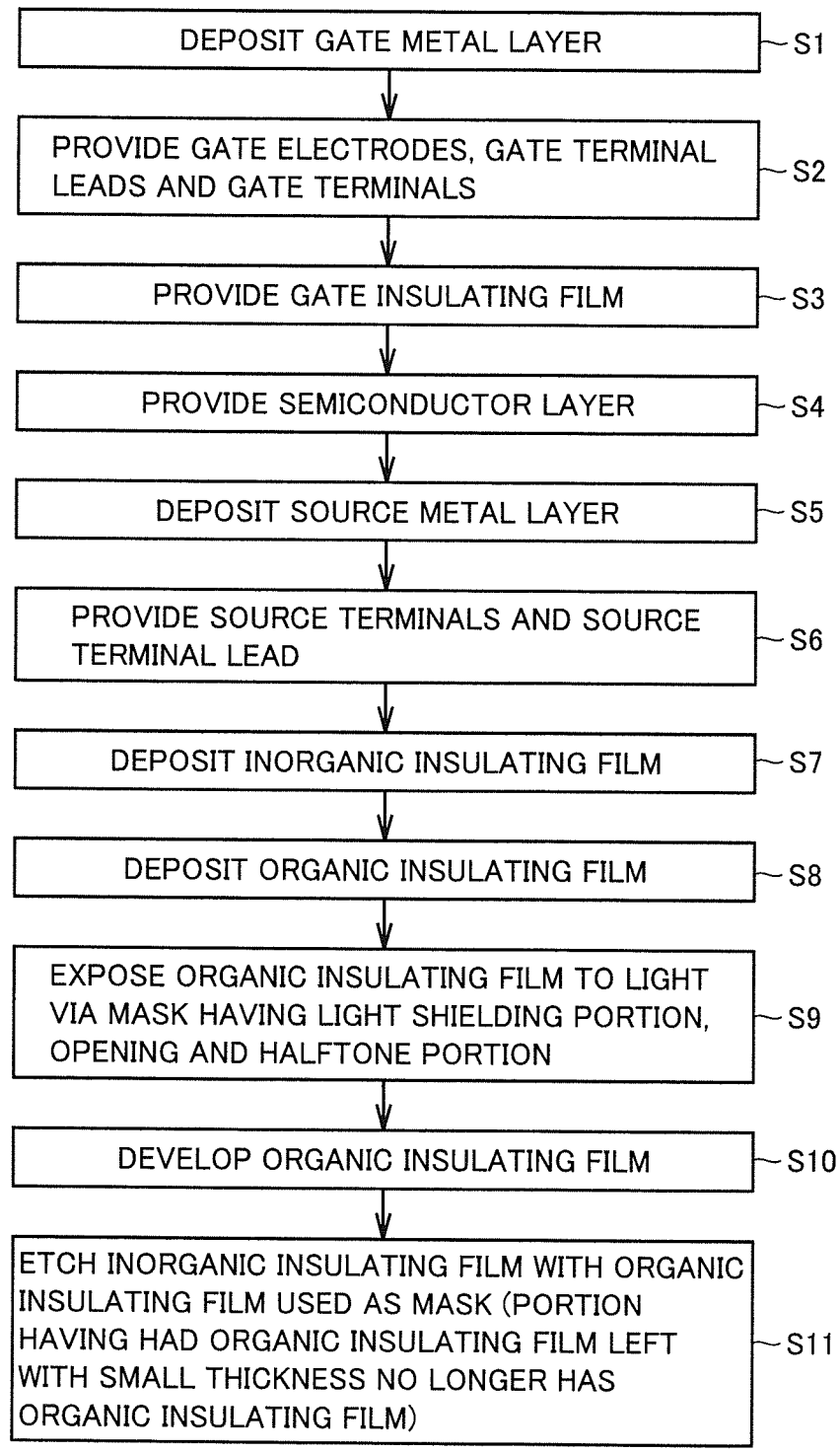
FIG. 14 is a flowchart of a method for producing a display panel in a third embodiment based on the present invention.

With reference to FIG. 14 to FIG. 25, the present invention in a third embodiment provides a method for producing a display panel, as will be described hereinafter. The method for producing the display panel in the present embodiment is a production method suitable for obtaining the display panel described in the first embodiment. FIG. 14 is a flowchart of the method for producing the display panel in the present embodiment.

The present embodiment provides a method for producing a display panel that has a display region including a plurality of pixels, a terminal region disposed outer than said display region, and an intermediate region located between said display region and said terminal region, and has a drive element for driving said pixel, including the steps of: depositing a gate metal layer on a surface of said substrate (S1); patterning said gate metal layer to provide a plurality of gate electrodes, gate terminal leads extending from said plurality of gate electrodes, respectively, and a plurality of gate terminals connected to said gate terminal leads at their respective ends (S2); providing a gate insulating film such that said plurality of gate electrodes and said gate terminal leads are covered therewith (S3); depositing a source metal layer such that said gate insulating film is covered therewith (S5); patterning said source metal layer to provide a plurality of source terminals alternating with said plurality of gate terminals and a source terminal lead extending from each of said plurality of source terminals (S6); depositing inorganic insulating film such that said plurality of source terminals and said source terminal lead are covered therewith (S7); depositing organic insulating film such that said inorganic insulating film is covered therewith (S8); exposing said organic insulating film to light via a mask having a light shielding portion that does not transmit light, an opening that transmits light as it is, and a halftone portion adjacent to both said light shielding portion and said opening and transmitting light at a transmittance smaller than said opening (S9); developing said organic insulating film to provide an intermediate region having said organic insulating film with a large thickness, and a terminal region including a portion with said organic insulating film left with a small thickness and a portion without said organic insulating film (S10); and etching said inorganic insulating film with said organic insulating film used as a mask so that said portion without said organic insulating film has said plurality of source terminals exposed and said terminal region at said portion with said organic insulating film left with the small thickness no longer has said organic insulating film and has said inorganic insulating film reduced to be smaller in thickness than that in a region covered with said organic insulating film (S11).

In the method for producing the display panel, normally, after step S3 is performed to provide the gate insulating film and before step S5 is performed to provide the source metal layer, a step S4 is performed to provide a semiconductor layer such that the gate insulating film is covered therewith.

Of the method for producing the display panel, steps S9-S11 will be described hereinafter more specifically.

Figure 15:
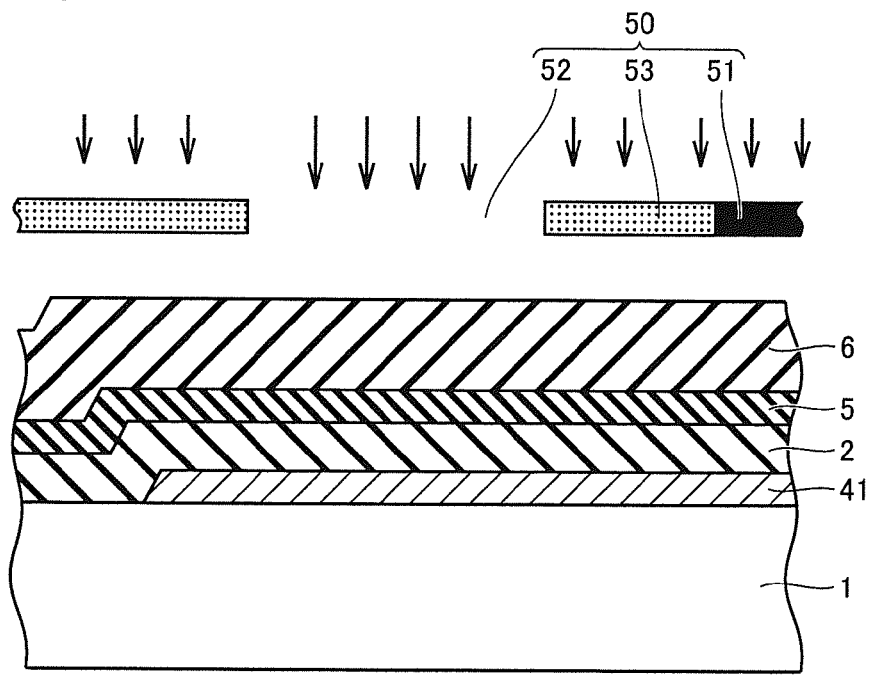
FIG. 15 is a view for illustrating a vicinity of a region that is intended for a gate terminal when exposure is performed as an intermediate step of the method for producing the display panel in the third embodiment based on the present invention.
Figure 16:
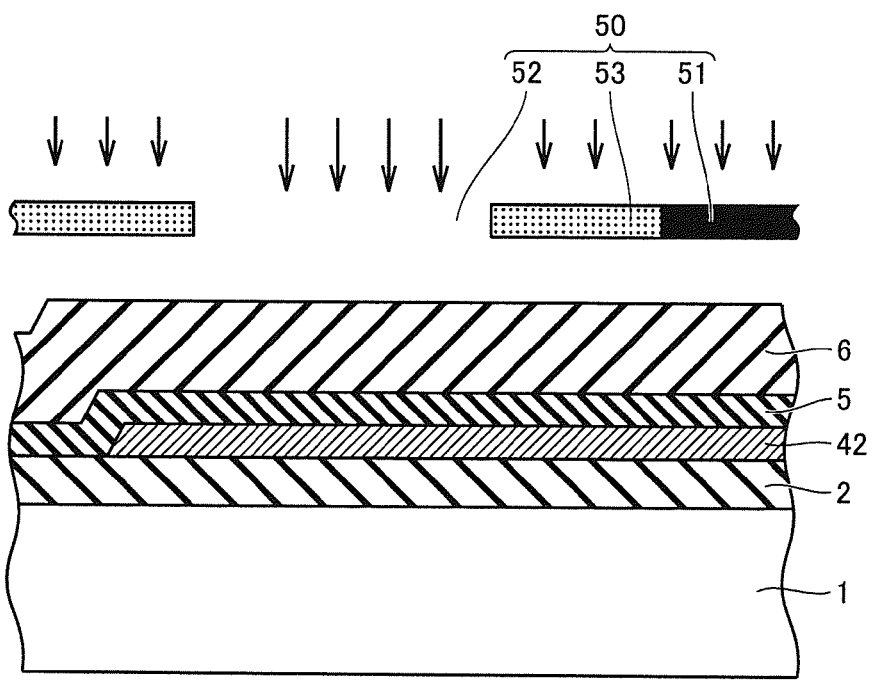
FIG. 16 is a view for illustrating a vicinity of a region that is intended for a source terminal when exposure is performed as an intermediate step of the method for producing the display panel in the third embodiment based on the present invention.

FIG. 15 and FIG. 16 show a vicinity of a region that is intended for a gate terminal and a vicinity of a region that is intended for a source terminal, respectively, in performing step S9.

In the vicinity of the region that is intended for the gate terminal, as shown in FIG. 15, on an upper surface of substrate 1, a patterned gate metal layer 41 is covered with gate insulating film 2, inorganic insulating film 5, and organic insulating film 6 stacked in layers. Exposure is performed through a mask 50. Mask 50 has a light shielding portion 51, an opening 52, and a halftone portion 53. In FIG. 15 opening 52 corresponds to a region that is to be a gate terminal later.

In the vicinity of the region that is intended for the source terminal, as shown in FIG. 16, substrate 1 has an upper surface covered initially with gate insulating film 2 and thereon a source metal layer 42 is provided in a pattern. Source metal layer 42 is covered with inorganic insulating film 5 and inorganic insulating film 5 is covered with organic insulating film 6. In FIG. 16 opening 52 corresponds to a region that is to be a source terminal later.

Figure 17:
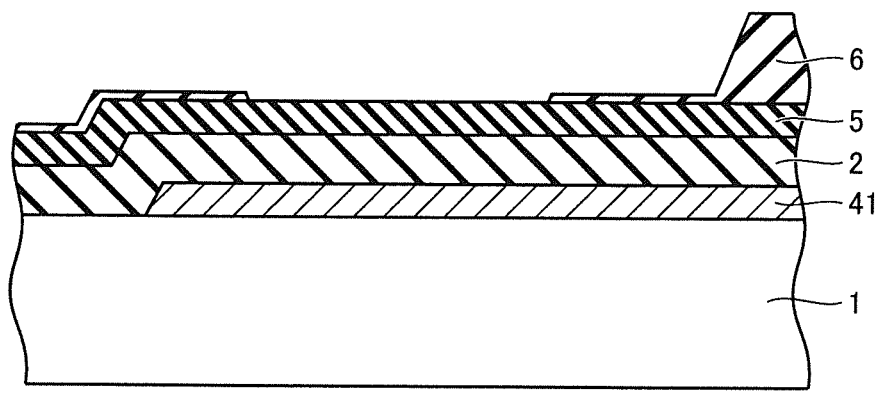
FIG. 17 is a view for illustrating a vicinity of the region that is intended for the gate terminal after an organic insulating film is developed as an intermediate step of the method for producing the display panel in the third embodiment based on the present invention.
Figure 18:
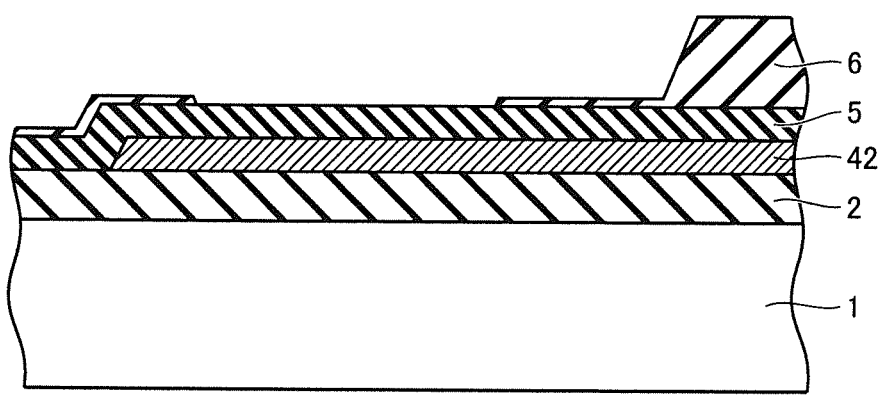
FIG. 18 is a view for illustrating a vicinity of the region that is intended for the source terminal after an organic insulating film is developed as an intermediate step of the method for producing the display panel in the third embodiment based on the present invention.

FIG. 17 and FIG. 18 show the vicinity of the region that is intended for the gate terminal and the vicinity of the region that is intended for the source terminal, respectively, in step S10 after organic insulating film 6 is developed. They both have a region corresponding to opening 52 such that organic insulating film 6 is eliminated, and a region corresponding to halftone portion 53 such that organic insulating film 6 remains with a small thickness.

Figure 19:
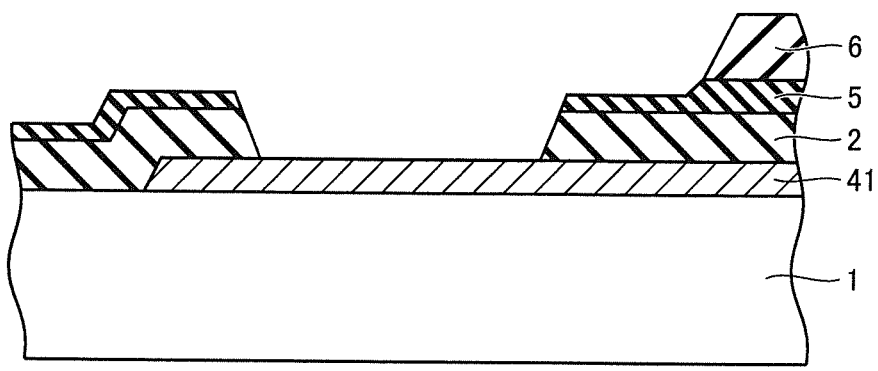
FIG. 19 is a view for illustrating a vicinity of the region that is intended for the gate terminal after the organic insulating film is used as a mask to etch an inorganic insulating film as an intermediate step of the method for producing the display panel in the third embodiment based on the present invention.
Figure 20:
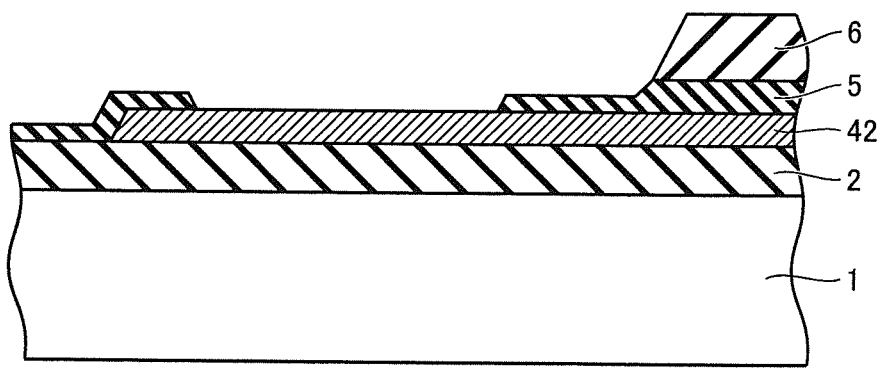
FIG. 20 is a view for illustrating a vicinity of the region that is intended for the source terminal after the organic insulating film is used as a mask to etch the inorganic insulating film as an intermediate step of the method for producing the display panel in the third embodiment based on the present invention.

FIG. 19 and FIG. 20 show the vicinity of the region that is intended for the gate terminal and the vicinity of the region that is intended for the source terminal, respectively, in step S11 after inorganic insulating film 5 is etched with organic insulating film 6 used as a mask. Both figures show that a region shown in FIGS. 17 and 18 with organic insulating film 6 left with a small thickness no longer has organic insulating film 6 and has inorganic insulating film 5 partially etched depthwise and thus reduced in thickness. The region having the organic insulating film left with a small thickness has the organic insulating film eliminated therefrom because although the organic insulating film serves as a mask it is etched away to some extent and the region with the organic insulating film initially having a small thickness has the organic insulating film etched away entirely in thickness while the inorganic insulating film is etched. As shown in FIG. 19, of the vicinity of the region that is intended for the gate terminal, the region that has had organic insulating film 6 eliminated therefrom in FIG. 17 has inorganic insulating film 5 and gate insulating film 2 eliminated therefrom. As shown in FIG. 20, of the vicinity of the region that is intended for the source terminal, the region that has had organic insulating film 6 eliminated therefrom in FIG. 18 has inorganic insulating film 5 eliminated therefrom.

Figure 21:
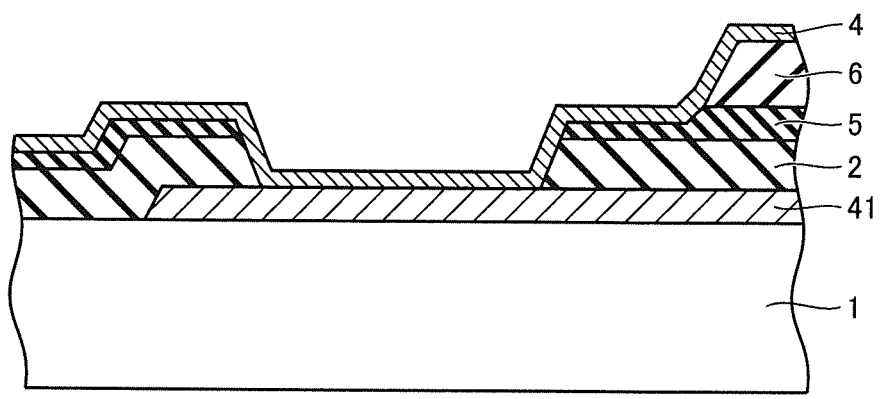
FIG. 21 is a view for illustrating a vicinity of the region that is intended for the gate terminal with an ITO film deposited throughout an entire surface as an intermediate step of the method for producing the display panel in the third embodiment based on the present invention.
Figure 22:
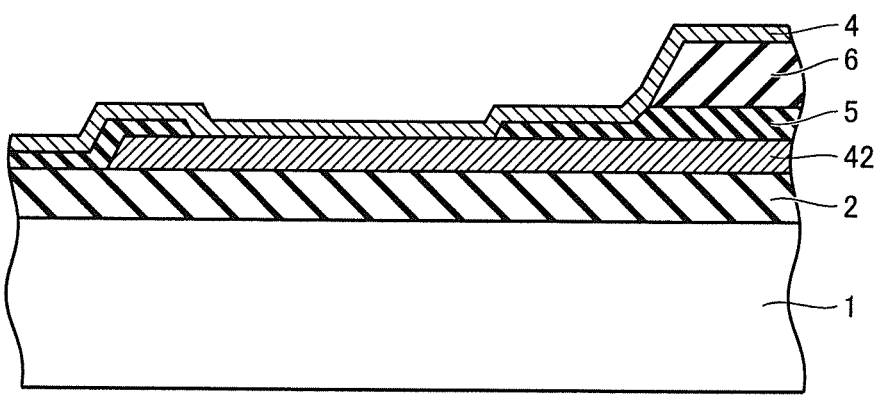
FIG. 22 is a view for illustrating a vicinity of the region that is intended for the source terminal with the ITO film deposited throughout the entire surface as an intermediate step of the method for producing the display panel in the third embodiment based on the present invention.

FIG. 21 and FIG. 22 show the vicinity of the region that is intended for the gate terminal and the vicinity of the region that is intended for the source terminal, respectively, with ITO film further deposited on an entire surface. A region corresponding to the mask 50 opening 52 is provided with ITO film 4 in direct contact with gate metal layer 41 and source metal layer 42.

Figure 23:
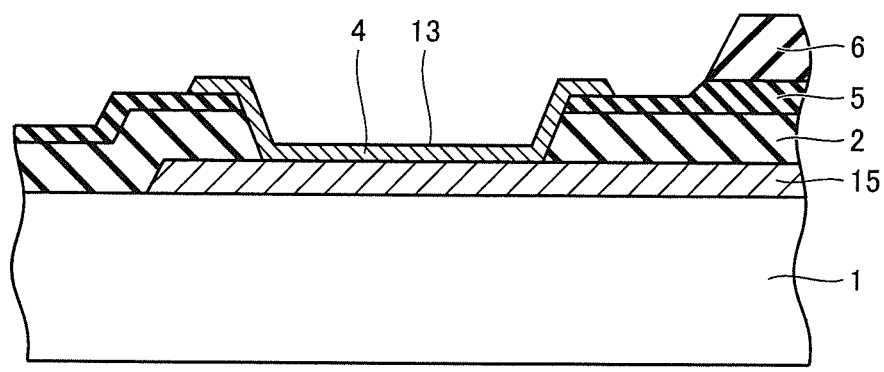
FIG. 23 is a view for illustrating a vicinity of the region that is intended for the gate terminal after the ITO film is patterned and has only a desired portion left as an intermediate step of the method for producing the display panel in the third embodiment based on the present invention.
Figure 24:
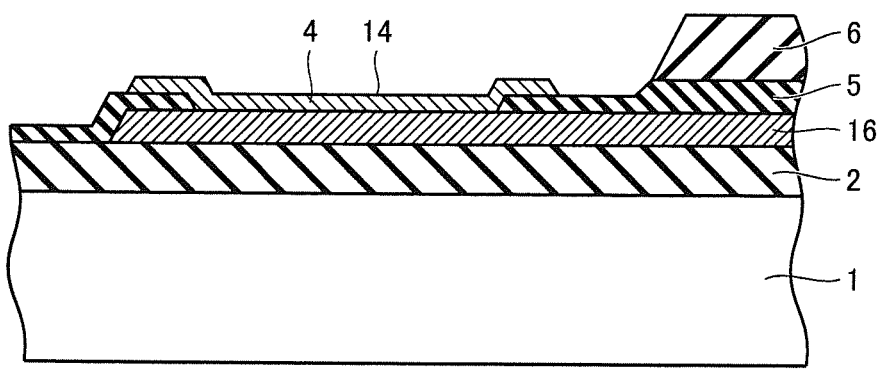
FIG. 24 is a view for illustrating a vicinity of the region that is intended for the source terminal after the ITO film is patterned and has only a desired portion left as an intermediate step of the method for producing the display panel in the third embodiment based on the present invention.

FIG. 23 and FIG. 24 show the vicinity of the region that is intended for the gate terminal and the vicinity of the region that is intended for the source terminal, respectively, after the ITO film is patterned to allow a desired portion to alone remain. Thus, as shown in FIG. 23, gate terminal 13 and gate terminal lead 15 are provided, and, as shown in FIG. 24, source terminal 14 and source terminal lead 16 are provided.

Figure 25:
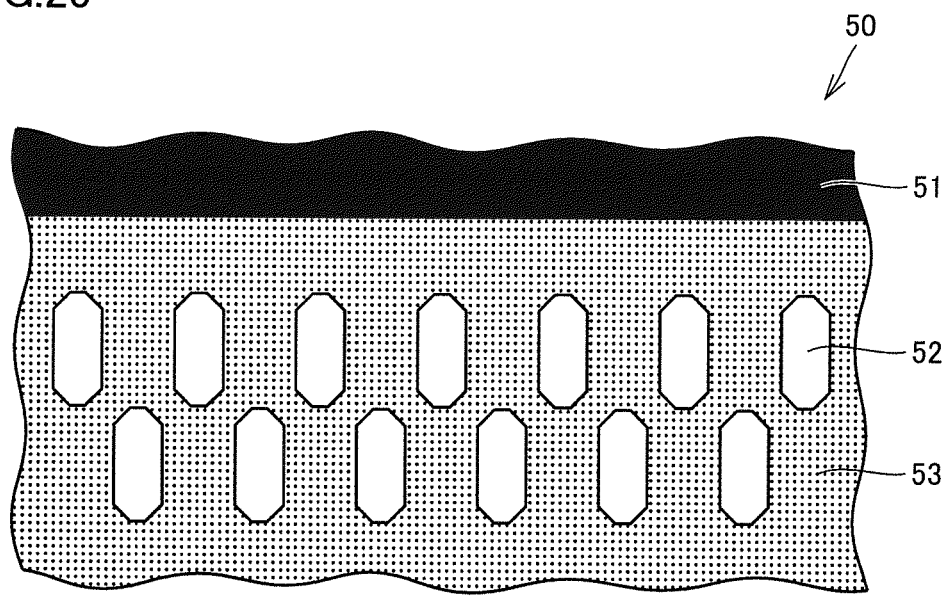
FIG. 25 is a plan view of a mask that can be used in the method for producing the display panel in the third embodiment based on the present invention.

When gate terminal 13 and source terminal 14 are to be provided in terminal region 83, as shown in FIG. 4, mask 50 such as shown in FIG. 25, for example, can be used.

The method for producing a display panel in the present embodiment can include the step of exposing an organic insulating film to light through a mask having a halftone portion (S9) and thus provide the organic insulating film with a portion different in thickness, and in step S11 this difference in thickness can be utilized to provide an inorganic insulating film with an opening for a source terminal and concurrently provide a region which a thin inorganic insulating film covers. This allows a terminal region having a source terminal lead covered with thin inorganic insulating film, and a structure in which a display panel has an external connection terminal provided along a single side by disposing a gate metal layer and a source metal layer in combination can be provided that has a source terminal lead protected. In other words, in the present embodiment, an inorganic insulating film can be provided to have a peripheral edge positioned to substantially overlap an end of a source terminal having a large line width and a source terminal lead having a small line width can be covered with and thus protected by the inorganic insulating film and hence against disconnection.

Fourth Embodiment

Figure 26:
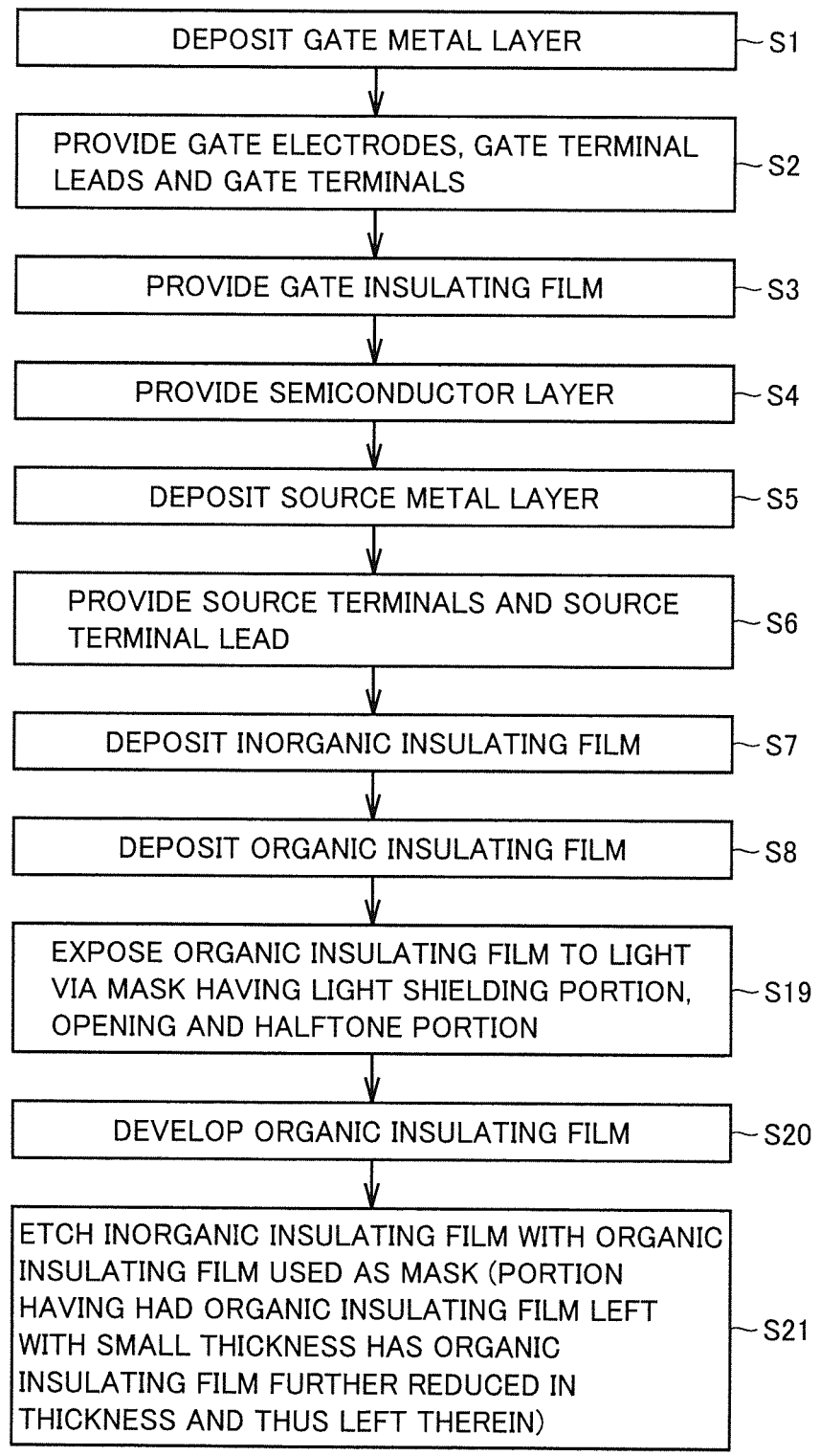
FIG. 26 is a flowchart of a method for producing a display panel in a fourth embodiment based on the present invention.

With reference to FIG. 26, the present invention in a fourth embodiment provides a method for producing a display panel, as will be described hereinafter. The method for producing the display panel in the present embodiment is a production method suitable for obtaining the display panel described in the second embodiment. FIG. 26 is a flowchart of the method for producing a display panel in the present embodiment.

The present embodiment provides a method for producing a display panel that has a display region including a plurality of pixels, a terminal region disposed outer than said display region, and an intermediate region located between said display region and said terminal region, and has a drive element for driving said pixel, including the steps of: depositing a gate metal layer on a surface of said substrate (S1); patterning said gate metal layer to provide a plurality of gate electrodes, gate terminal leads extending from said plurality of gate electrodes, respectively, and a plurality of gate terminals connected to said gate terminal leads at their respective ends (S2); providing a gate insulating film such that said plurality of gate electrodes and said gate terminal leads are covered therewith (S3); depositing a source metal layer such that said gate insulating film is covered therewith (S5); patterning said source metal layer to provide a plurality of source terminals alternating with said plurality of gate terminals and a source terminal lead extending from each of said plurality of source terminals (S6); depositing inorganic insulating film such that said plurality of source terminals and said source terminal lead are covered therewith (S7); depositing organic insulating film such that said inorganic insulating film is covered therewith (S8); exposing said organic insulating film to light via a mask having a light shielding portion that does not transmit light, an opening that transmits light as it is, and a halftone portion adjacent to both said light shielding portion and said opening and transmitting light at a transmittance smaller than said opening (S19); developing said organic insulating film to provide a first sub-intermediate region having said organic insulating film with a large thickness, a second sub-intermediate region having said organic insulating film left with a small thickness, and a terminal region that is a portion without said organic insulating film (S20); and etching said inorganic insulating film with said organic insulating film used as a mask so that said terminal region has said plurality of source terminals exposed and said second sub-intermediate region has said organic insulating film further reduced in thickness and thus left therein (S21).

In the method for producing the display panel, normally, after step S3 is performed to provide the gate insulating film and before step S5 is performed to provide the source metal layer, a step S4 is performed to provide a semiconductor layer such that the gate insulating film is covered therewith.

In the present embodiment step S8 is performed to provide the organic insulating film with an adjusted width and the organic insulating film is exposed to light for an adjusted period of time so that as a result of step S20 the second sub-intermediate region also has the organic insulating film still left with a small thickness.

The method for producing a display panel in the present embodiment can include the step of exposing an organic insulating film to light through a mask having a halftone portion (S19) and thus provide the organic insulating film with a portion different in thickness, and in step S21 this difference in thickness can be utilized to provide an inorganic insulating film with an opening for a source terminal and concurrently provide a region which a thin organic insulating film covers. Thus the second sub-intermediate region adjacent to the terminal region has the source terminal lead covered with thin organic insulating film, and a structure in which a display panel has an external connection terminal provided along a single side by disposing gate metal and source metal in combination can be provided that has a source terminal lead protected.

Hereinafter will be described a structure of halftone portion 53 of mask 50 applicable to both the third and fourth embodiments.

The light shielding portion is a film formed of a light shielding material, and the halftone portion may be the film with a thickness smaller than that of the light shielding portion. The light shielding material is chromium for example. The light shielding portion may be formed of film of chromium.

Figure 27:
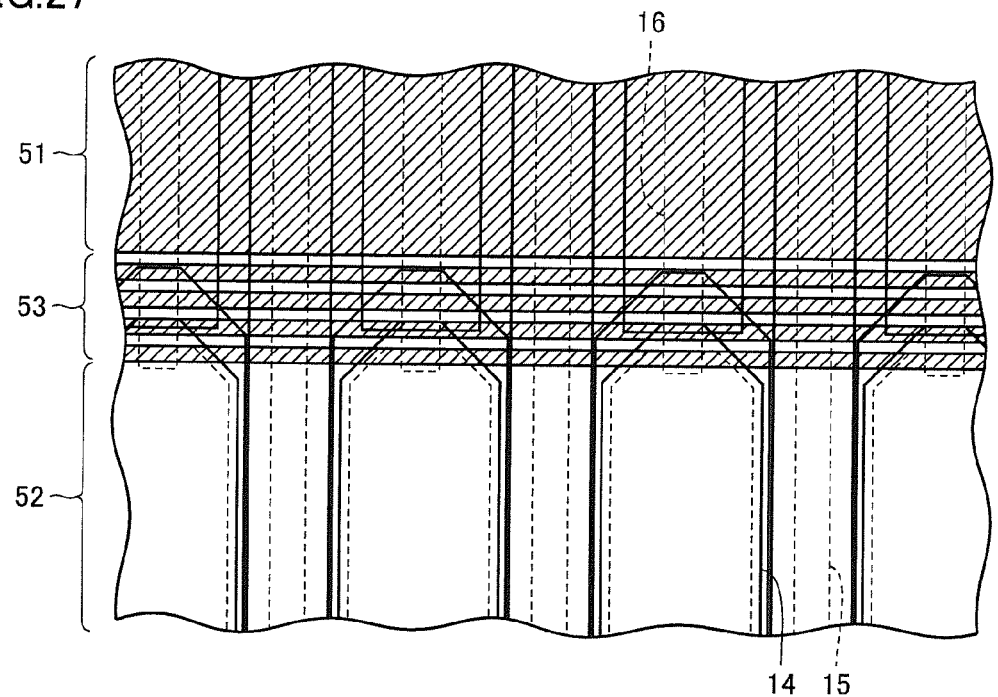
FIG. 27 is a view for illustrating a first example of a halftone portion that can be used in the method for producing the display panel in the third and fourth embodiments based on the present invention.
Figure 28:
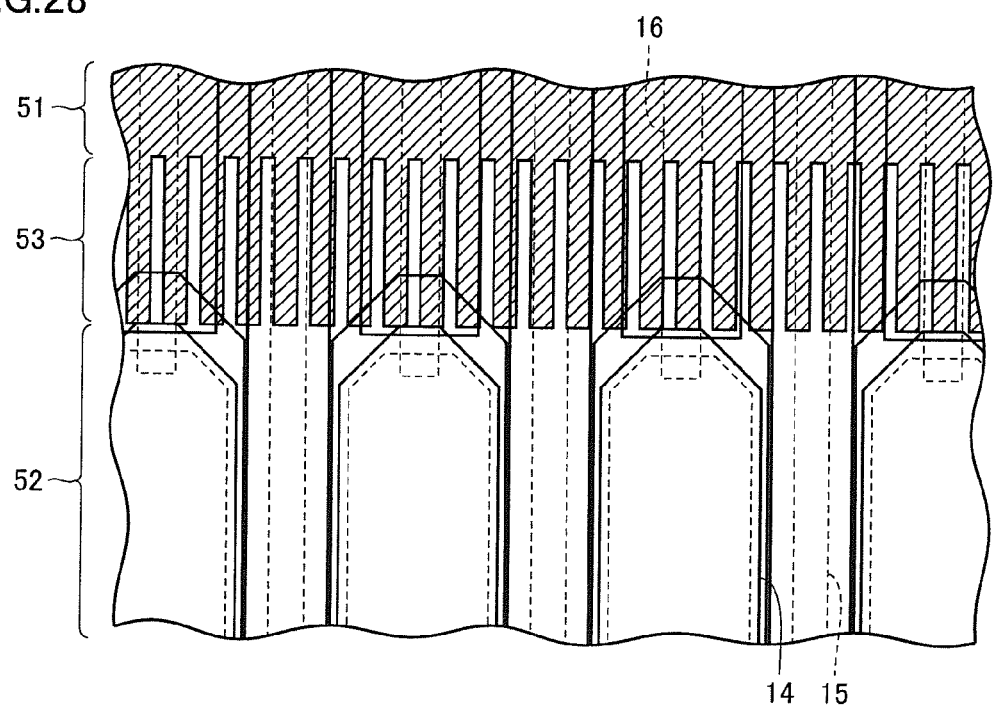
FIG. 28 is a view for illustrating a second example of the halftone portion that can be used in the method for producing the display panel in the third and fourth embodiments based on the present invention.

The light shielding portion is a film formed of a light shielding material, and the halftone portion may be the film with a plurality of slits. For example, as shown in FIG. 27, halftone portion 53 may be a peripheral edge of a source material film forming light shielding portion 51 provided with a large number of parallel slits extending across the terminals in a lateral striped pattern. Alternatively, as shown in FIG. 28, halftone portion 53 may be a peripheral edge of a source material film forming light shielding portion 51 provided with a large number of parallel cuts extending along the terminals in a vertical striped pattern. The FIG. 27 halftone portion 53 has its constituent light shielding portions each having a width of about 2 µm and spaced from an immediately adjacent constituent light shielding portion by about 1.5 µm. These dimensions may be set, as appropriate, depending on the thickness of organic insulating film 6 and the like.

Figure 29:
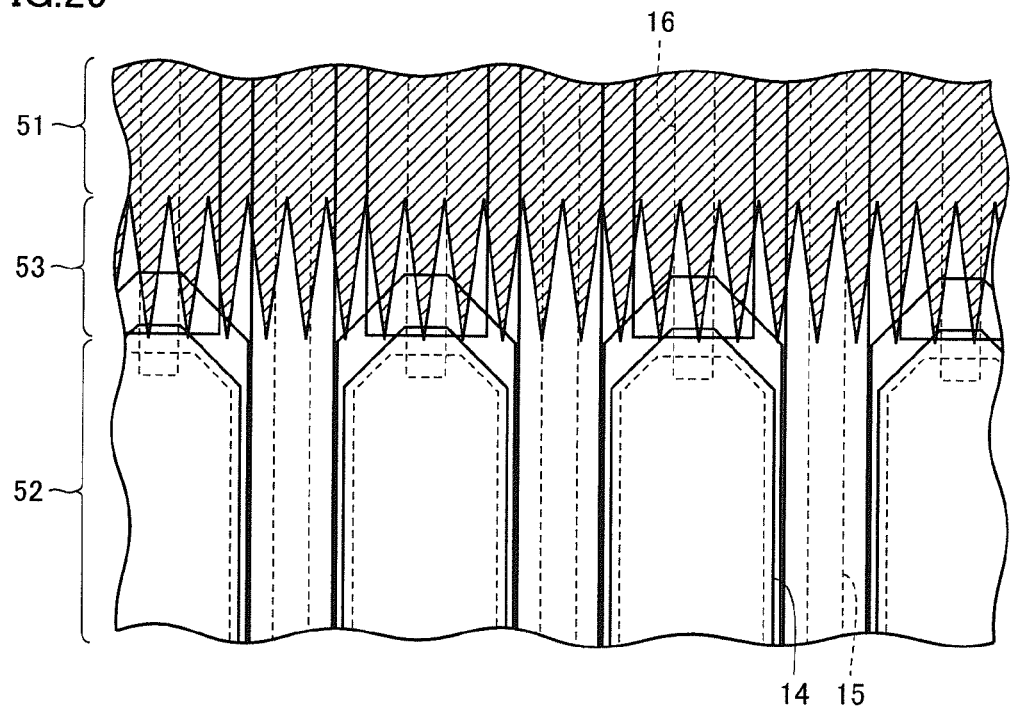
FIG. 29 is a view for illustrating a third example of the halftone portion that can be used in the method for producing the display panel in the third and fourth embodiments based on the present invention.
Figure 30:
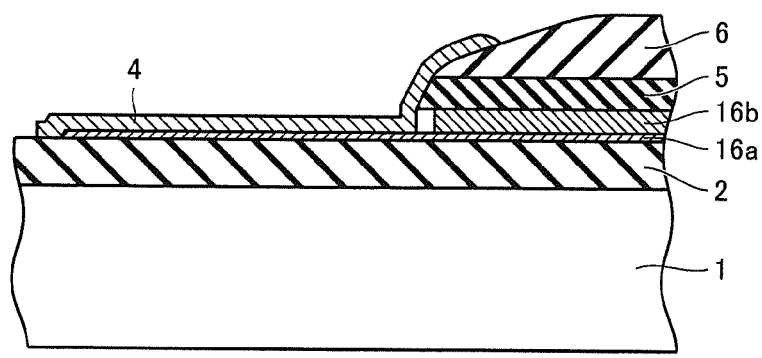
FIG. 30 is a cross section of an example of using the halftone portion shown in FIG. 29 to form a step having a gentle inclination at an end of the organic insulating film.

The light shielding portion is a film formed of a light shielding material, and the halftone portion may be a zigzagged edge of the film. Being zigzagged as referred to herein means being formed in a zigzag having a length that enters to be larger than its pitch. For example, it may be as shown in FIG. 29. The FIG. 29 halftone portion has portions different in transmittance and thus gradually varies in transmittance, and, as shown in FIG. 30, a step having a gentle inclination at an end of organic insulating film 6 can be provided.

While the halftone portion can be implemented by varying a material in thickness or providing a slit, as described above, it can also be implemented by providing a fine pattern, since the fine pattern can adjust the entire region's transmittance. Note that "halftone" implemented by providing a fine pattern is herein referred to as "gray tone".

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

INDUSTRIAL APPLICABILITY

The present invention is applicable to a display panel and a method for producing the same.

REFERENCE SIGNS LIST

1: substrate; 2: gate insulating film; 3: semiconductor layer; 4: ITO film; 5: inorganic insulating film; 6: organic insulating film; 13: gate terminal; 14: source terminal; 15: gate terminal lead; 16: source terminal lead; 16a: Ti layer; 16b: Al layer; 17: bump; 18: IC; 19: ACF particle; 20: TFT element; 21: gate electrode; 22: source electrode; 23: drain electrode; 31: step; 32: portion; 41, 41t: gate metal layer; 42: source metal layer; 50: mask; 51: light shielding portion; 52: opening; 53: halftone portion; 81: display region; 82: intermediate region; 82a: first sub-intermediate region; 82b: second sub-intermediate region; 83: terminal region; 91: arrow; 101,102: liquid crystal display panel; 200: driver; 300: gate wiring group; 400: source wiring group.

The invention claimed is:

1. A display panel that has:
a display region including a plurality of pixels,
a terminal region disposed outer than said display region, as seen in a plane, and an intermediate region located between said display region and said terminal region; and
a drive element for driving said pixel,
said drive element including a gate electrode, a gate insulating film covering said gate electrode, and a source electrode partially covering said gate insulating film,
said terminal region having a plurality of gate terminals and a plurality of source terminals disposed therein alternately as seen in a plane, said plurality of gate terminals being formed of a gate metal layer that is the same layer as said gate electrode, said plurality of source terminals being formed of a source metal layer that is the same layer as said source electrode,
from each of said source terminals a source terminal lead extending toward said intermediate region, said source terminal lead being formed of said source metal layer,
said intermediate region and said terminal region being provided with inorganic insulating film such that said source terminal lead is covered therewith,
said intermediate region being provided with organic insulating film such that said inorganic insulating film is covered therewith,
said inorganic insulating film being smaller in thickness in said terminal region than in said intermediate region,
said inorganic insulating film having an opening in said terminal region to expose at least a portion of a surface of said source terminal.

2. A display panel that has:
a display region including a plurality of pixels,
a terminal region disposed outer than said display region, as seen in a plane, and
an intermediate region located between said display region and said terminal region; and
a drive element for driving said pixel,
said drive element including a gate electrode, a gate insulating film covering said gate electrode, and a source electrode partially covering said gate insulating film,
said terminal region having a plurality of gate terminals and a plurality of source terminals disposed therein alternately as seen in a plane, said plurality of gate terminals being formed of a gate metal layer that is the same layer as said gate electrode, said plurality of source terminals being formed of a source metal layer that is the same layer as said source electrode,
from each of said source terminals a source terminal lead extending toward said intermediate region, said source terminal lead being formed of said source metal layer,
said intermediate region being provided with inorganic insulating film such that said source terminal lead is covered therewith, and organic insulating film such that said inorganic insulating film is covered therewith,
said intermediate region including a first sub-intermediate region with said organic insulating film having a first thickness, and a second sub-intermediate region located between said first sub-intermediate region and said terminal region with said organic insulating film having a second thickness smaller than said first thickness,
said inorganic insulating film being interrupted at a boundary between said second sub-intermediate region and said terminal region to expose at least a portion of a surface of said source terminal.

3. A method for producing a display panel that has:
a display region including a plurality of pixels,
a terminal region disposed outer than said display region, and
an intermediate region located between said display region and said terminal region; and
a drive element for driving said pixel, the method comprising the steps of:
depositing a gate metal layer on a surface of a substrate;
patterning said gate metal layer to provide a plurality of gate electrodes, gate terminal leads extending from said plurality of gate electrodes, respectively, and a plurality of gate terminals connected to said gate terminal leads at their respective ends;
providing a gate insulating film such that said plurality of gate electrodes and said gate terminal leads are covered therewith;
depositing a source metal layer such that said gate insulating film is covered therewith;
patterning said source metal layer to provide a plurality of source terminals alternating with said plurality of gate terminals and a source terminal lead extending from each of said plurality of source terminals;
depositing inorganic insulating film such that said plurality of source terminals and said source terminal lead are covered therewith;
depositing organic insulating film such that said inorganic insulating film is covered therewith;
exposing said organic insulating film to light via a mask having a light shielding portion that does not transmit light, an opening that transmits light as it is, and a halftone portion adjacent to both said light shielding portion and said opening and transmitting light at a transmittance smaller than said opening;
developing said organic insulating film to provide an intermediate region having said organic insulating film with a large thickness, and a terminal region including a portion with said organic insulating film left with a small thickness and a portion without said organic insulating film; and
etching said inorganic insulating film with said organic insulating film used as a mask so that said portion without said organic insulating film has said plurality of source terminals exposed and said terminal region at said portion with said organic insulating film left with said small thickness no longer has said organic insulating film and has said inorganic insulating film reduced to be smaller in thickness than that in a region covered with said organic insulating film.

4. The method for producing a display panel according to claim 3, wherein said light shielding portion is a film formed of a light shielding material and said halftone portion is said film with a thickness smaller than that of said light shielding portion.

5. The method for producing a display panel according to claim 3, wherein said light shielding portion is a film formed of a light shielding material and said halftone portion is said film with a plurality of slits.

6. The method for producing a display panel according to claim 3, wherein said light shielding portion is a film formed of a light shielding material and said halftone portion is a zigzagged edge of said film.

* * * * *